(12) United States Patent
Nomura

(10) Patent No.: US 12,712,038 B2
(45) Date of Patent: Aug. 18, 2026

(54) SEMICONDUCTOR INTEGRATED CIRCUIT

(71) Applicant: ROHM CO., LTD., Kyoto (JP)

(72) Inventor: Naohiro Nomura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 198 days.

(21) Appl. No.: 18/655,437

(22) Filed: May 6, 2024

(65) Prior Publication Data

US 2024/0386978 A1 Nov. 21, 2024

(30) Foreign Application Priority Data

May 15, 2023 (JP) ................................ 2023-080248

(51) Int. Cl.
*G11C 17/18* (2006.01)
*G11C 17/16* (2006.01)

(52) U.S. Cl.
CPC ............ *G11C 17/18* (2013.01); *G11C 17/165* (2013.01)

(58) Field of Classification Search
CPC ................................................. G11C 17/18
USPC ....................................................... 365/96
See application file for complete search history.

(56) References Cited

U.S. PATENT DOCUMENTS 6,426,908 B1 * 7/2002 Hidaka .................... G11C 5/14 365/222
8,791,749 B2 * 7/2014 Nakamura ............. H10D 84/00 327/540
2002/0191472 A1 * 12/2002 Okamoto .............. G11C 5/147 365/227
2008/0068910 A1 * 3/2008 Jao ........................... G11C 7/20 365/206

FOREIGN PATENT DOCUMENTS

JP 2005085980 A 3/2005
WO 2023276733 A1 1/2023

* cited by examiner

*Primary Examiner* — Muna A Techane
(74) *Attorney, Agent, or Firm* — CANTOR COLBURN LLP

(57) ABSTRACT

A semiconductor integrated circuit includes: a power supply pin configured to receive an external power supply voltage; a fuse memory circuit including a fuse element; and a power supply circuit, whose output is connected to the fuse memory circuit, configured to receive the external power supply voltage, the power supply circuit being switchable in response to a control signal between (i) a first state in which an internal power supply voltage of a first voltage level, which is capable of cutting the fuse element, is supplied to a power supply line of the fuse memory circuit and (ii) a second state in which the internal power supply voltage of a second voltage level lower than the first voltage level, which is incapable of cutting the fuse element, is supplied to the power supply line of the fuse memory circuit.

11 Claims, 13 Drawing Sheets

FIG. 1

100
WRT_EN
DATA
120
Control circuit
104
110
F2
F1
INV1
INV2
MN2
MN1
106
130
CNT
$V_{DD2}$ ( = $V_1$ or $V_2$ )
$V_{DD1}$
102
CNT
VDD
GND 100A
WRT_EN
DATA
120
104
110
VDD2
F1
F2
INV1
INV2
MN1
MN2
106
130A
SW1
140
EN
VDD1
102
CNT
VDD
GND 130Ab
102
$V_{DD1}$
VDD
M3
M2
143
108
CNT
Vb
M1
144
$I_{REF}$
SW1
104
$V_{DD2}$
146
146
106
GND
142b
140b 130Ac
CNT
108
SW1
M3
143
$V_{DD2}$
104
M2
M1
$V_{DD1}$
Vb
106
$I_{REF}$
148
102
140c
142c
144
VDD
GND 130Ad
CNT
108
SW1
M3
143
EN
102
M2
M1
$V_{DD2}$
104
Vb
106
142d
$V_{DD1}$
$V_{DD3}$
152
R12
R11
140d
156
150
M21
$V_{REF}$
154
$V_{GS}$
R21
$V_{ZD}$
ZD21
VDD
GND 130Ae
142e
156
VDD
VDD1
102
R21
M21
M3
VZD
VGS
VDD3
M2
143
108
CNT
EN
160
162
VREF
VG
M1
SW1
ZD21
VFB
R32
164
104
VDD2
R31
106
GND
140e

SEMICONDUCTOR INTEGRATED CIRCUIT

CROSS-REFERENCE TO RELATED APPLICATION(S)

This application is based upon and claims the benefit of priority from Japanese Patent Application No. 2023-080248, filed on May 15, 2023, the entire contents of which are incorporated herein by reference.

TECHNICAL FIELD

The present disclosure relates to a semiconductor integrated circuit including a fuse memory circuit.

BACKGROUND

Trimming is known as a technique for adjusting characteristics and changing configurations of various semiconductor devices after manufacture. Trimming may be performed continuously (in an analog manner) or discretely (in a digital manner). Recently, digital trimming is preferred due to its cost advantage.

The reason for the cost advantage is that miniaturization makes it easier to use area-efficient digital circuits, and the need is eliminated for extra test flows such as laser trimming or the like.

Further, since the trimming value is fixed, yield improvement by switching functions and eliminating defect products due to on/off of redundant circuits is also a factor in preferring digital trimming.

The following methods are known as digital trimming methods.

- Nonvolatile memory (EEPROM, Flash memory, FeRAM, MRAM, PRAM, etc.)
- Fuse (polysilicon fusing, or metal wiring fusing)
- Anti-fuse (Zener zapping, or gate oxide film breakdown)

A fuse memory circuit generally includes a fuse element such as polysilicon or metal wiring, and a transistor connected in series to the fuse element. One bit of information is maintained (or held) in the fuse memory circuit by cutting/conducting the fuse element. In a programming (trimming) process, a high power supply voltage is applied across the transistor and the fuse element. In this state, by turning on the transistor, a large current flows through the fuse element, which makes it possible to cut the fuse element.

BRIEF DESCRIPTION OF DRAWINGS

The accompanying drawings, which are incorporated in and constitute a part of the specification, illustrate embodiments of the present disclosure.

FIG. 1 is a circuit diagram showing a basic configuration of a fuse memory circuit.

FIG. 11 is a block diagram showing an example of a semiconductor integrated circuit.

FIG. 12 is a diagram showing another example of a semiconductor integrated circuit.

DETAILED DESCRIPTION

Figure 2:
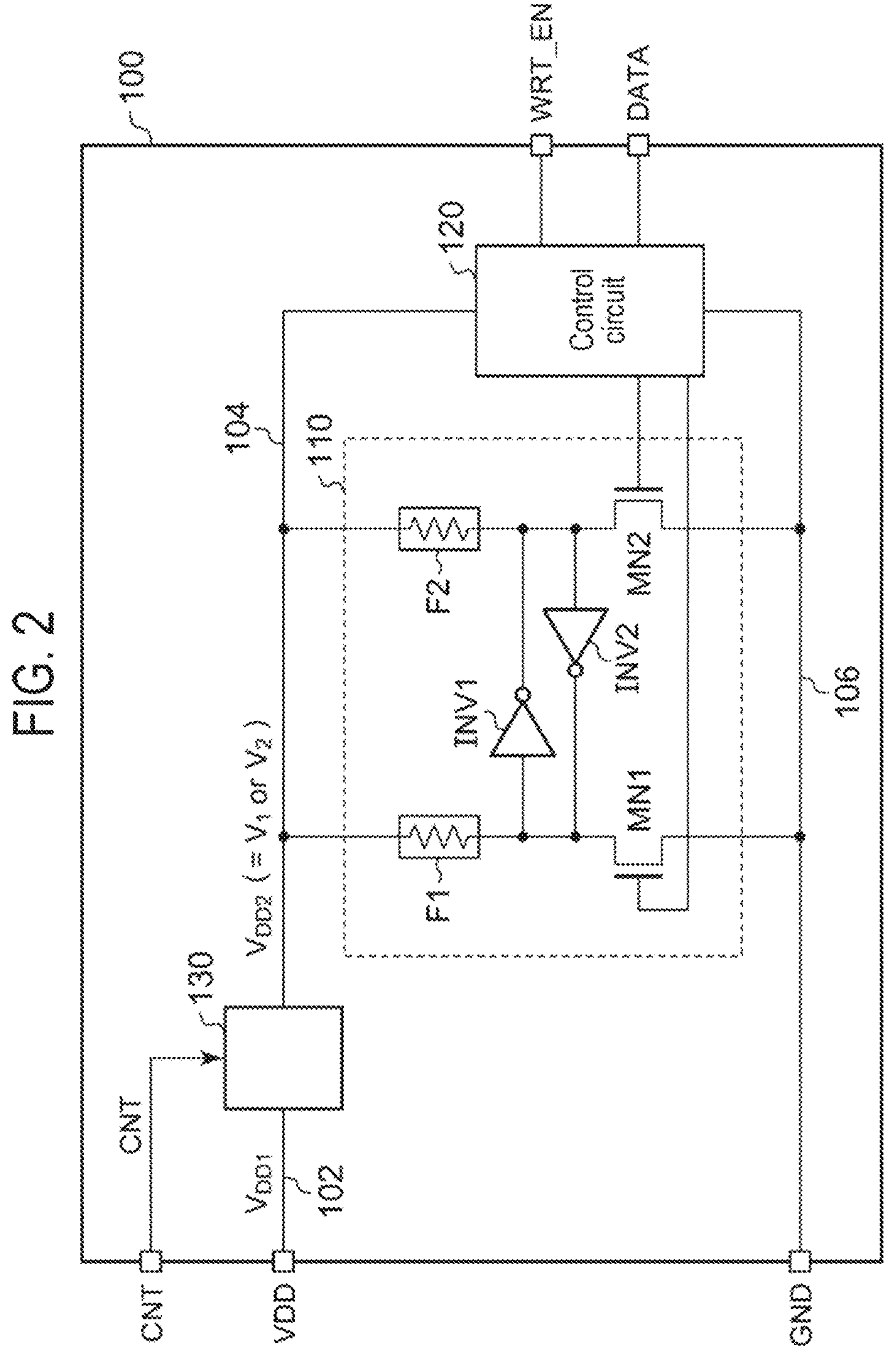
FIG. 2 is a circuit diagram of a semiconductor integrated circuit according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Summary of Embodiment

A summary of some exemplary embodiments of the present disclosure will be described. This summary is intended to provide a simplified description of some concepts of one or more embodiments in order to provide a basic understanding of the embodiments as a prelude to the following detailed description, and is not intended to limit the breadth of the invention or the disclosure. This summary is not an exhaustive overview of all conceivable embodiments and is not intended to identify key elements of all embodiments or to delineate the scope of any or all embodiments. For the sake of convenience, "one embodiment" may be used to refer to one embodiment (example or modification) or multiple embodiments (examples or modifications) disclosed in this specification.

A semiconductor integrated circuit according to an embodiment includes: a power supply pin configured to receive an external power supply voltage; a fuse memory circuit including a fuse element; and a power supply circuit having an output connected to the fuse memory circuit, and configured to receive the external power supply voltage, the power supply circuit being switchable in response to a control signal between (i) a first state in which an internal power supply voltage of a first voltage level, which is capable of cutting the fuse element, is supplied to a power supply line of the fuse memory circuit and (ii) a second state in which the internal power supply voltage of a second voltage level lower than the first voltage level, which is incapable of cutting the fuse element, is supplied to the power supply line of the fuse memory circuit.

According to this configuration, when programming the fuse memory circuit, the fuse memory circuit can be cut by setting the power supply circuit to the first state. After completion of programming, when the semiconductor integrated circuit operates normally, the power supply circuit is set to the second state. In the second state, even if a failure occurs in a transistor constituting the fuse memory circuit, the fuse element is not cut since the current flowing through the fuse element does not exceed a threshold current for cutting. In this way, it is possible to enhance the reliability of the fuse memory circuit.

In one embodiment, the first voltage level may be substantially equal to the external power supply voltage.

In one embodiment, the power supply circuit may include a constant voltage circuit configured to be in a disable state in the first state, and be in an enable state in the second state, and generate the internal power supply voltage of the second voltage level in the power supply line of the fuse memory circuit, and a switch installed between the power supply pin and the power supply line of the fuse memory circuit and configured to be turned on in the first state and turned off in the second state.

In one embodiment, the constant voltage circuit may include a first transistor installed between the power supply pin and the power supply line of the fuse memory circuit, and a power supply control circuit configured to supply a control voltage to a control terminal of the first transistor.

In one embodiment, the constant voltage circuit may be a source follower circuit or an emitter follower circuit.

In one embodiment, the power supply control circuit may include a constant current source configured to generate a constant current, and at least one constant voltage element installed on a path of the constant current, and may be configured to supply the control voltage based on a voltage drop of the at least one constant voltage element to the control terminal of the first transistor.

In one embodiment, the constant voltage element may be a field effect transistor (FET) having a gate and a drain that are connected.

In one embodiment, the power supply control circuit may include a constant current source configured to generate a constant current, and an impedance element installed on a path of the constant current, and may be configured to supply the control voltage based on a voltage drop of the impedance element to the control terminal of the first transistor.

In one embodiment, a voltage control circuit may include a linear regulator.

In one embodiment, the constant voltage circuit may further include a second transistor connected in series to the first transistor between the power supply pin and the power supply line of the fuse memory circuit and configured to be turned off in the first state and turned on in the second state.

In one embodiment, the power supply circuit may include a variable voltage circuit configured to generate the internal power supply voltage of the first voltage level in the power supply line of the fuse memory circuit in the first state and generate the internal power supply voltage of the second voltage level in the power supply line of the fuse memory circuit in the second state.

In one embodiment, the variable voltage circuit may include a first transistor installed between the power supply pin and the power supply line of the fuse memory circuit, and a voltage control circuit configured to fully turn on the first transistor in the first state and feedback control a voltage at a control terminal of the first transistor so that the internal power supply voltage is brought close to the second voltage level in the second state.

In one embodiment, the variable voltage circuit may include a first transistor installed between the power supply pin and the power supply line of the fuse memory circuit, and an operational amplifier having an input node receiving a feedback voltage based on the internal power supply voltage and a reference voltage and an output connected to a control terminal of the first transistor, wherein a voltage level of the reference voltage may be switchable between the first state and the second state.

Embodiment

Hereinafter, preferred embodiments will be described with reference to the drawings. Identical or equivalent components, members, and processes shown in each drawing are designated by like reference numerals, and redundant explanations thereof will be omitted as appropriate. Further, the embodiments are exemplary rather than limiting the disclosure and the invention. All features and combinations thereof described in the embodiments are not necessarily essential to the disclosure and the invention.

In the present disclosure, “a state where a member A is connected to a member B” includes a case where the member A and the member B are physically directly connected or even a case where the member A and the member B are indirectly connected via any other member that does not affect an electrical connection state between the members A and B or does not impair functions and effects achieved by combinations of the members A and B.

Similarly, “a state where a member C is installed between a member A and a member B” includes a case where the member A and the member C or the member B and the member C are indirectly connected through any other member that does not affect an electrical connection state between the members A and C or the members B and C or does not impair functions and effects achieved by combinations of the members A and C or the members B and C, in addition to a case where the member A and the member C or the member B and the member C are directly connected.

First, a basic configuration of a fuse memory circuit and problems that occur therein will be described.

Figure 1:
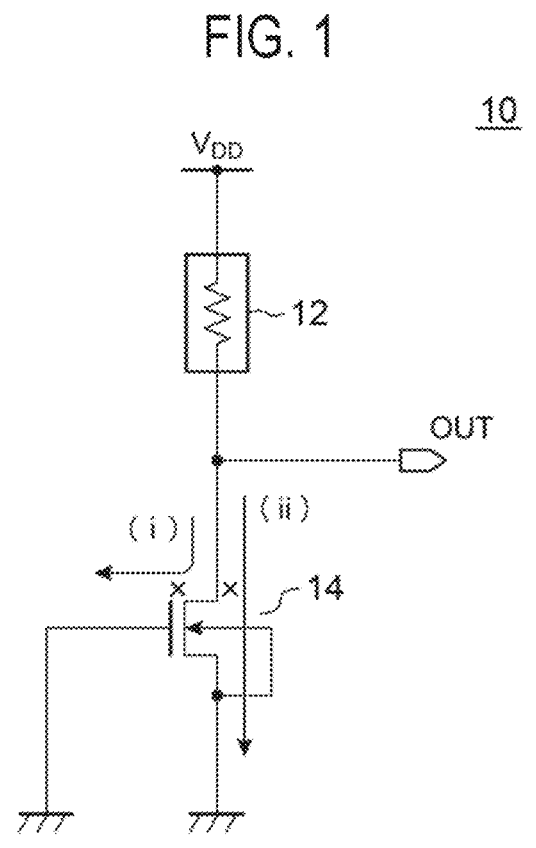

FIG. 1 is a circuit diagram showing a basic configuration of a fuse memory circuit 10. The fuse memory circuit 10 includes a fuse element 12 and a fuse-cutting transistor 14.

In a programming process, when a high-level write enable signal is applied to a gate of the transistor 14, the transistor 14 is turned on and a voltage VDD is applied across the fuse element 12. As a result, a current flows through the fuse element 12, and the fuse element 12 is cut. This state is a state in which 1 (or 0) is written. In the programming process, unless the transistor 14 is turned on, the fuse element 12 remains in an electrical connection state. This state is a state in which 0 (or 1) is written.

After the programming process, the semiconductor integrated circuit including the fuse memory circuit 10 is shipped and incorporated into a final product. During the operation of the final product, the gate of transistor 14 is kept low as shown in FIG. 1, and the transistor 14 is turned off. The output node OUT is at a high level (VDD) if the fuse element is not cut. The output node OUT is at high impedance if the fuse element is cut.

The present inventor has come to recognize that the following problems occur in the fuse memory circuit 10.

Failures occurring in the transistor 14 include gate oxide film breakdown and diffusion junction breakdown. The gate oxide film breakdown is called TDDB (Time Dependent Dielectric Breakdown), and is a failure of an insulating film (a gate oxide film or an insulating film between wirings) that occurs over time.

Generally, dielectric breakdown occurs when a strong electric field is applied to a gate oxide film of a transistor. TDDB occurs when a weak electric field is applied for a long time. When TDDB occurs, a current path (i) is generated from the drain to the gate of the transistor. When TDDB occurs in the transistor 14, a current flows to the fuse element 12 through the current path (i), and the fuse element 12 that has not been cut may be cut.

Diffusion junction breakdown occurs when a leakage current path (ii) is generated from the drain to the back gate and from the drain to the source due to damage to the junction surface between the transistor's drain diffusion layer and well. The impedance decreases and the current increases, eventually resulting in a short circuit condition. When the transistor 14 goes into a short-circuit state, a current flows through the fuse element 12, and the fuse element 12 that has not been cut may be cut.

As described above, in the fuse memory circuit 10, there is a problem in that when a failure occurs in the transistor 14 for writing, the stored value is destroyed. A semiconductor integrated circuit that can solve this problem will be described below.

FIG. 2 is a circuit diagram of a semiconductor integrated circuit 100 according to an embodiment. The semiconductor integrated circuit 100 includes a first power supply line 102, a second power supply line 104, a ground line 106, a fuse memory circuit 110, a control circuit 120, and a power supply circuit 130.

An external power supply voltage $V_{DD1}$ is supplied to a power supply pin VDD of the semiconductor integrated circuit 100. A ground pin GND is grounded. A control signal CNT instructing an operation mode of the semiconductor integrated circuit 100 is inputted to a control pin CNT. The control signal CNT is fixed at a predetermined level when writing (programming) the fuse memory circuit 110.

The fuse memory circuit 110 is a 1-bit memory cell that includes a fuse element. The fuse memory circuit 110 includes fuse elements F1 and F2, transistors MN1 and MN2, and inverters INV1 and INV2. When the transistor MN1 is turned on in a programming process, a current flows through the fuse element F1, thereby cutting the fuse element F1. Conversely, when the transistor MN2 is turned on, a current flows through the fuse element F2, thereby cutting the fuse element F2.

The control circuit 120 receives a write enable signal WRT_EN and data DATA. The control circuit 120 selectively (complementarily) cuts the fuse element F1 and the fuse element F2 according to the data DATA in the programming process. The state in which the fuse element F1 is cut is a state in which a value 1 is written, and the state in which the fuse element F2 is cut is a state in which a value 0 is written.

The configuration of the fuse memory circuit 110 shown here is merely an example, and the configuration of the fuse memory circuit 110 is not particularly limited in the present disclosure.

The power supply circuit 130 receives the external power supply voltage $V_{DD1}$ through the first power supply line 102. The output terminal of the power supply circuit 130 is connected to the fuse memory circuit 110 through the second power supply line 104.

The power supply circuit 130 is switchable between a first state ω1 and a second state ω2. In the first state ω1, the power supply circuit 130 supplies the second power supply line 104 connected to the fuse memory circuit 110 with an internal power supply voltage $V_{DD2}$ of a first voltage level $V_1$ that is capable of cutting the fuse elements F1 and F2.

In the second state ω2, the power supply circuit 130 supplies the second power supply line 104 with an internal power supply voltage $V_{DD2}$ of a second voltage level $V_2$ which is lower than the first voltage level $V_1$ and incapable of cutting the fuse elements F1 and F2.

When a drain-source voltage of the transistor MN1 is assumed to be $V_{DS}$ and a resistance value of the fuse element F1 is assumed to be $R_F$, a current $I_C$ flowing through the fuse element F1 is $I_C=(V_{DD2}-V_{DS})/R_F$. Since the fuse element F1 is cut when a current exceeding a certain threshold value $I_{TH}$ flows therethrough, the fuse element F1 is cut when $(V_{DD2}-V_{DS})/R_F>I_{TH}$ holds true, i.e., when $V_{DD2}>I_{TH}\cdot R_F+V_{DS}$ holds true. Therefore, the first voltage level $V_1$ only needs to satisfy $V_1>I_{TH}\cdot R_F+V_{DS}$.

Conversely, when $(V_{DD2}-V_{DS})/R_F F<I_{TH}$ holds true, in other words, when $V_{DD2}<I_{TH}\cdot R_F+V_{DS}$ holds true, the fuse element F1 is not cut. Therefore, the second voltage level $V_2$ only needs to satisfy $V_2<I_{TH}\cdot R_F+V_{DS}$.

The above is a configuration of the semiconductor integrated circuit 100. Next, the operation thereof will be described.

In the programming process of the semiconductor integrated circuit 100, an external power supply voltage $V_{DD1}$ is supplied to the power supply pin VDD of the semiconductor integrated circuit 100 from an external tester (not shown). Further, the control signal CNT of a first level (e.g., high level) is inputted to the control pin CNT. In response to the control signal CNT of the first level, the power supply circuit 130 is set to the first state ω1 and generates an internal power supply voltage $V_{DD2}$ of the first voltage level $V_1$ in the second power supply line In the programming process, a write enable signal WRT_EN is asserted. The control circuit 120 turns on one of the two transistors MN1 and MN2 according to the value of data DATA. As a result, one of the fuse elements F1 and F2 connected in series to the turned-on transistor is cut.

After programming, the semiconductor integrated circuit 100 is shipped and mounted on an electronic device designed by a user. During operation of the electronic device, the external power supply voltage $V_{DD1}$ is supplied to the power supply pin VDD of the semiconductor integrated circuit 100 from a power supply circuit of the electronic device. The external power supply voltage $V_{DD1}$ may include the same voltage level as or a different voltage level from the external power supply voltage $V_{DD1}$ supplied in the trimming process.

In a state in which the semiconductor integrated circuit 100 is mounted on an electronic device, the control signal CNT of a second level (e.g., low level) is inputted to the control pin CNT. In response to the control signal CNT of the second level, the power supply circuit 130 is set to the second state ω2 and generates an internal power supply voltage $V_{DD2}$ of the second voltage level $V_2$ in the second power supply line 104.

It is assumed that during the operation of the semiconductor integrated circuit 100, a failure of short-circuit mode occurs in the transistor MN1, or the transistor MN1 is erroneously operated and turned on due to surge noise. At this time, a current $I_C$ flows through the fuse element F1 but the current $I_C$ does not exceed the threshold value $I_{TH}$ since the internal power supply voltage $V_{DD2}$ is low. Therefore, the fuse element F1 is not cut and can be protected. The same applies to the fuse element F2.

Further, if the fuse element F1 is not cut in the programming process, the internal power supply voltage $V_{DD2}$ of the low second voltage level $V_2$ will be applied to the drain of the transistor MN1 during the operation of the semiconductor integrated circuit 100. This provides an effect that the deterioration of the transistor MN1 itself can be suppressed as compared to a case where a voltage of a high voltage level is applied to the drain of the transistor MN1. The same applies to the transistor MN2.

The present disclosure is applicable to various devices and methods that can be understood from the block diagram or circuit diagram of FIG. 2 or derived from the above description, and is not limited to a particular configuration. More specific configurations and examples will be described below in order not to narrow the scope of the present disclosure but to help understand and clarify the essence and operation of the present disclosure.

Example 1

Figure 3:
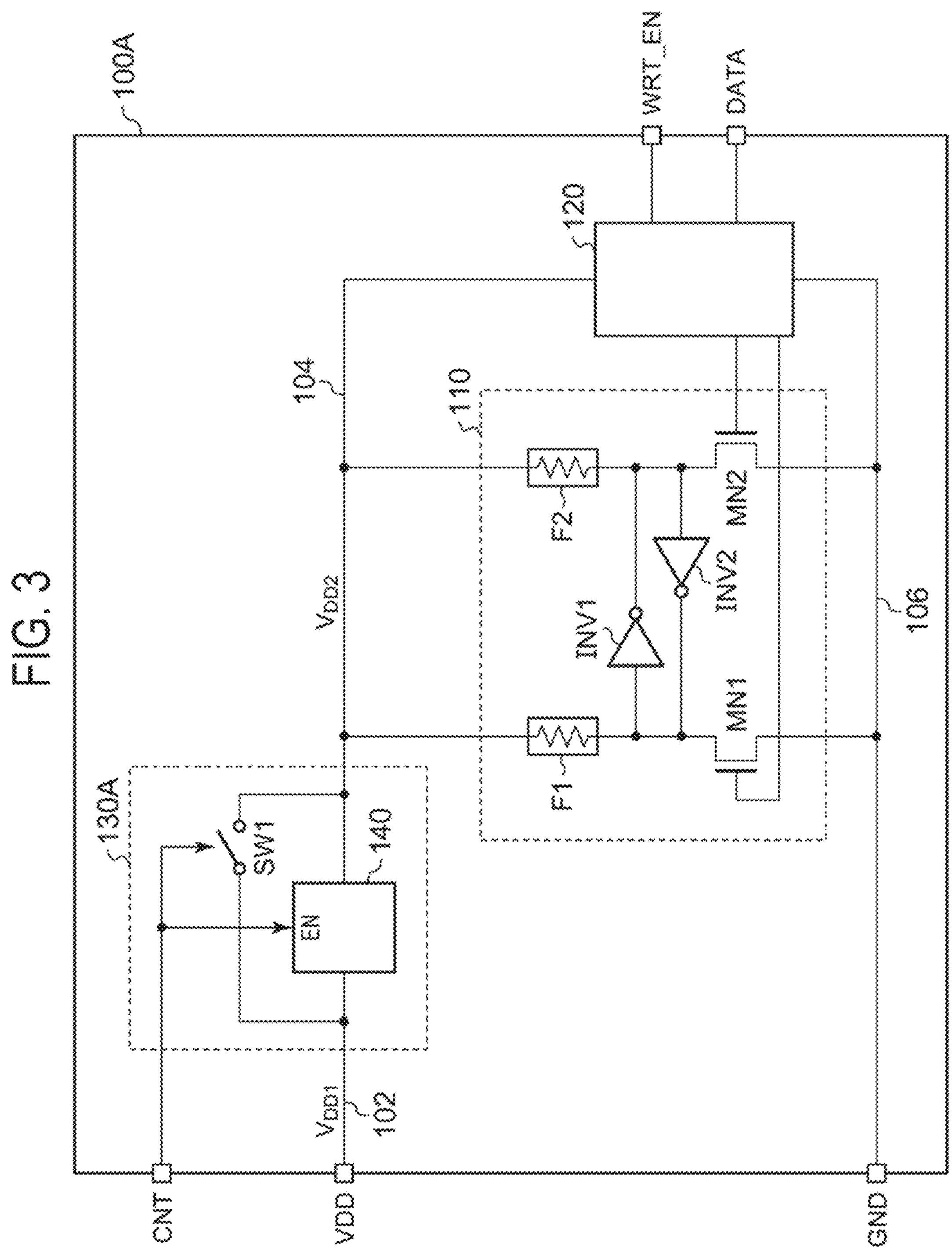
FIG. 3 is a circuit diagram of a semiconductor integrated circuit according to Embodiment 1.

FIG. 3 is a circuit diagram of a semiconductor integrated circuit 100A according to Embodiment 1. A power supply circuit 130A includes a constant voltage circuit 140 and a switch SW1. The switch SW1 is connected between a power supply pin VDD (first power supply line 102) and a second power line 104. The switch SW1 is turned on when the control signal CNT is at the first level.

The constant voltage circuit 140 includes an enable terminal EN. The constant voltage circuit 140 is disabled when the control signal CNT is at the first level, and is enabled when the control signal CNT is at the second level. In the enable state, the constant voltage circuit 140 generates an internal power supply voltage $V_{DD2}$ of the second voltage level $V_2$ in the second power supply line 104.

The operation of the semiconductor integrated circuit 100A will be described. When the control signal CNT is at the first level, the constant voltage circuit 140 is in a disable state and the switch SW1 is turned on. At this time, the voltage level $V_1$ of the internal power supply voltage $V_{DD2}$ generated on the second power supply line 104 is substantially equal to the voltage level of the external power supply voltage $V_{DD1}$. $V_{DD2} \approx V_{DD1}$ When the control signal CNT is at the second level, the constant voltage circuit 140 is enabled and the switch SW1 is turned off. At this time, the internal power supply voltage $V_{DD2}$ of the second voltage level $V_2$ is generated in the second power supply line 104.

Next, a configuration example of the power supply circuit 130A will be described.

Figure 4:
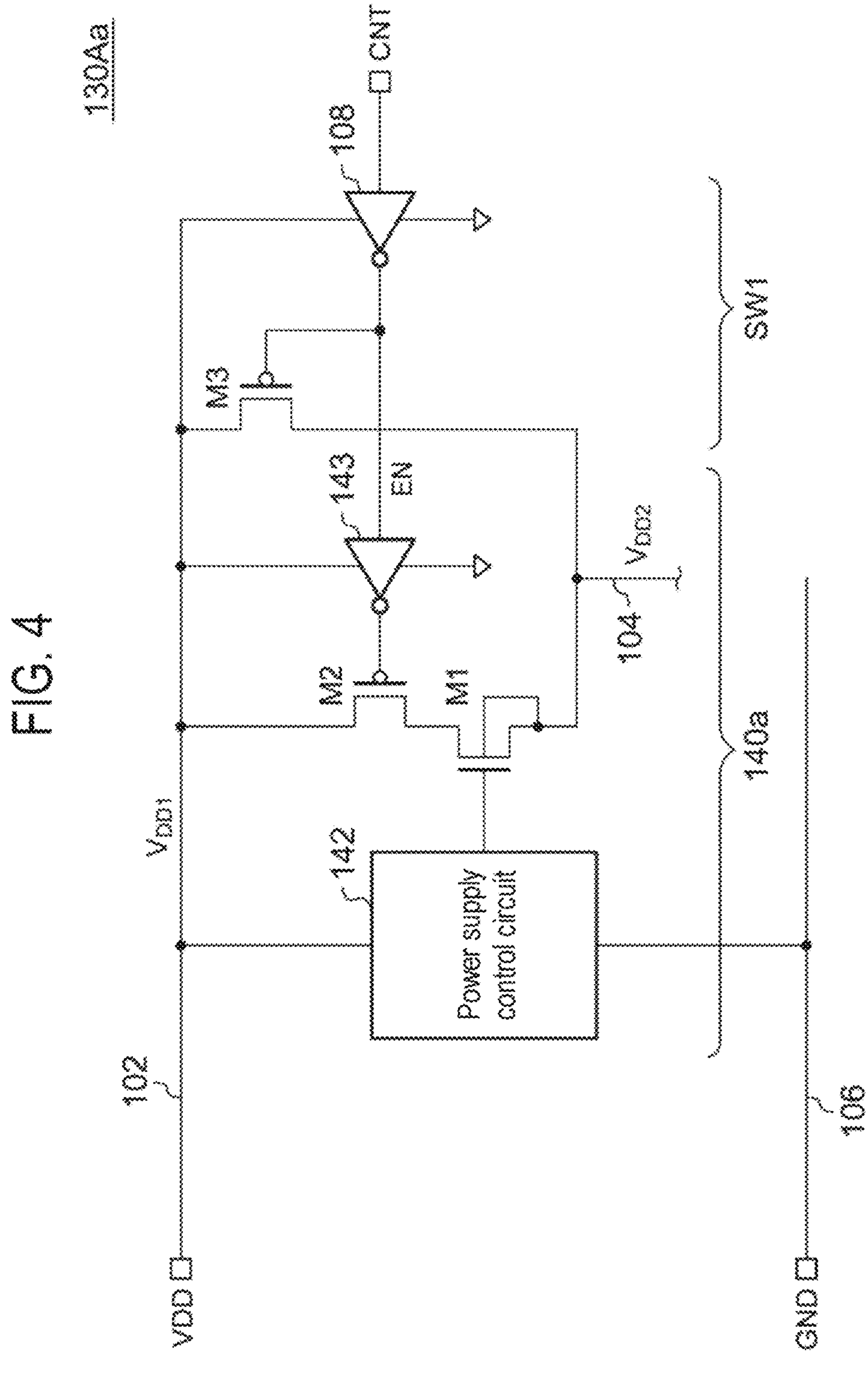
FIG. 4 is a circuit diagram of a power supply circuit according to one embodiment.

FIG. 4 is a circuit diagram of a power supply circuit 130Aa according to one embodiment. The switch SW1 includes a third transistor M3, which is a P-channel MOSFET (Metal Oxide Semiconductor Field Effect Transistor), and an inverter 108. When the control signal CNT is at the first level (high level), a voltage of a low level (0 V) is applied to the gate of the third transistor M3, and the third transistor M3 is turned on. When the control signal CNT is at the second level (low level), a voltage of a high level ($V_{DD1}$) is applied to the gate of the third transistor M3, and the third transistor M3 is turned off.

The constant voltage circuit 140*a* includes a first transistor M1, a second transistor M2, a power supply control circuit 142, and an inverter 143.

The first transistor M1 and the power supply control circuit 142 form a main part of the constant voltage circuit. The power supply control circuit 142 supplies an appropriate gate voltage to the control terminal (gate) of the first transistor M1, thereby generating the internal power supply $V_{DD2}$ of the second voltage level $V_2$ in the source of the first transistor M1 (second power supply line 104). As described later, the power supply control circuit 142 and the first transistor M1 may constitute a source follower circuit (voltage clamp circuit) or a linear regulator.

The second transistor M2 is installed to switch an enable state and a disable state of the constant voltage circuit 140*a*. The second transistor M2 is connected in series to the first transistor M1 between the first power supply line 102 and the second power supply line 104. The second transistor M2 is a PMOS transistor, and the output signal of the inverter 143 is supplied to the control terminal (gate) of the second transistor M2.

When the control signal CNT is at the first level (high level), a voltage of a high level ($V_{DD1}$) is applied to the gate of the second transistor M2, the second transistor M2 is turned off, and the constant voltage circuit 140*a* is in a disable state. When the control signal CNT is at the second level (low level), a voltage of a low level (0 V) is applied to the gate of the second transistor M2, and the second transistor M2 is turned on. Thus, the constant voltage circuit 140*a* is in an enable state.

Figure 5:
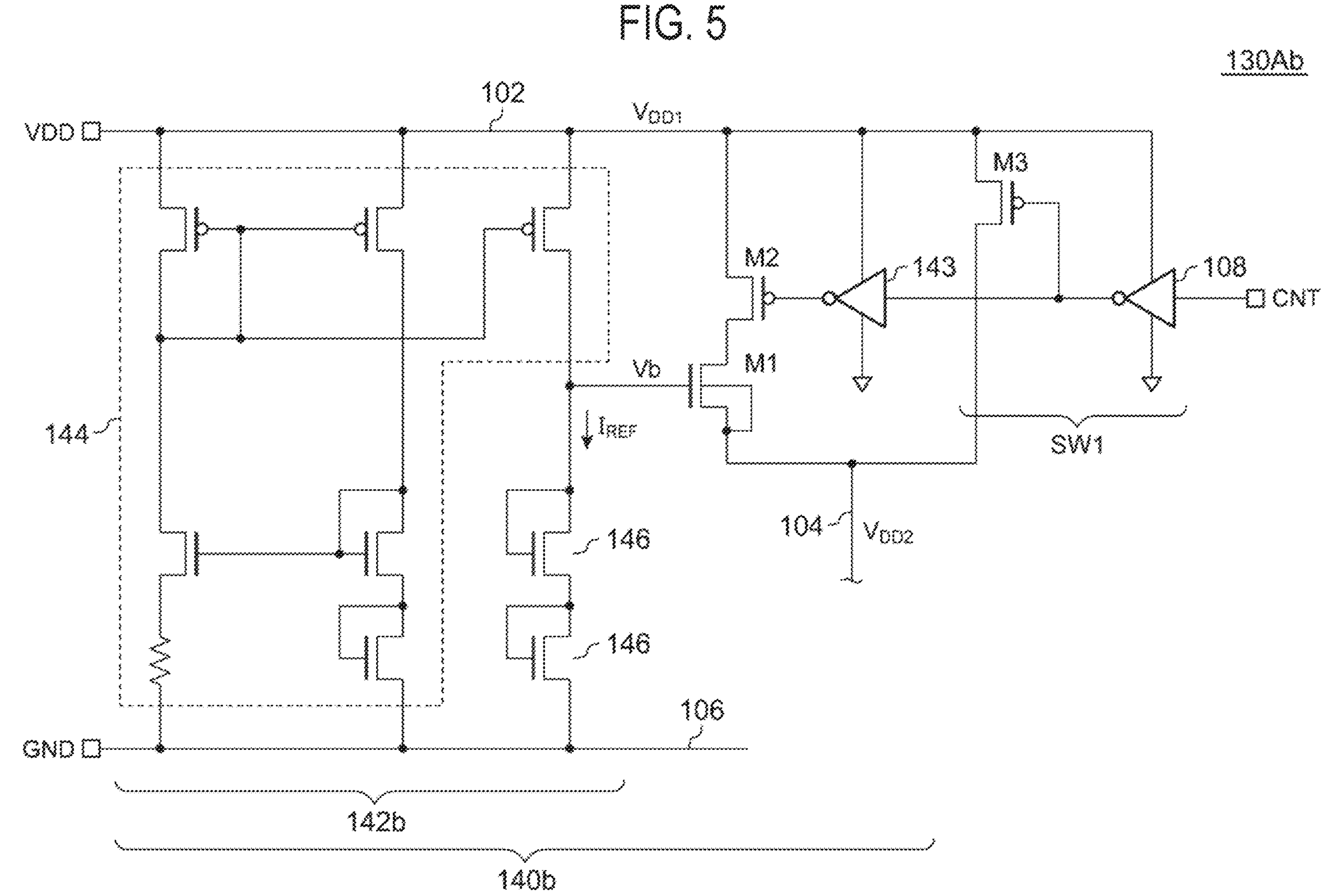
FIG. 5 is a circuit diagram of a power supply circuit according to one embodiment.

FIG. 5 is a circuit diagram of a power supply circuit 130Ab according to one embodiment. The constant voltage circuit 140*b* is a source follower circuit (voltage clamp circuit). The power supply control circuit 142*b* supplies a bias voltage Vb of a predetermined level to the gate of the first transistor M1. When the gate-source voltage of the first transistor M1 is $V_{GS}$, the second voltage level $V_2$ is $V_2 = Vb - V_{GS}$.

The power supply control circuit 142*b* includes a constant current source 144 and a plurality of constant voltage elements 146. The constant current source 144 is a reference current source and generates a reference current $I_{REF}$ that does not depend on the power supply voltage $V_{DD1}$. The constant voltage elements 146 are installed on the path of the reference current $I_{REF}$. In this example, the constant voltage elements 146 are N-channel MOSFETs whose gate and drain are connected, and the bias voltage Vb is $Vb = 2 \times V_{GS}$. A resistor may be installed instead of the constant current source 144.

According to this configuration, the voltage level of the bias voltage Vb, and further the second voltage level $V_2$, can be designed depending on the number of constant voltage elements 146. As the constant voltage elements 146, diodes or Zener diodes may be used, or different types of constant voltage elements may be combined.

Figure 6:
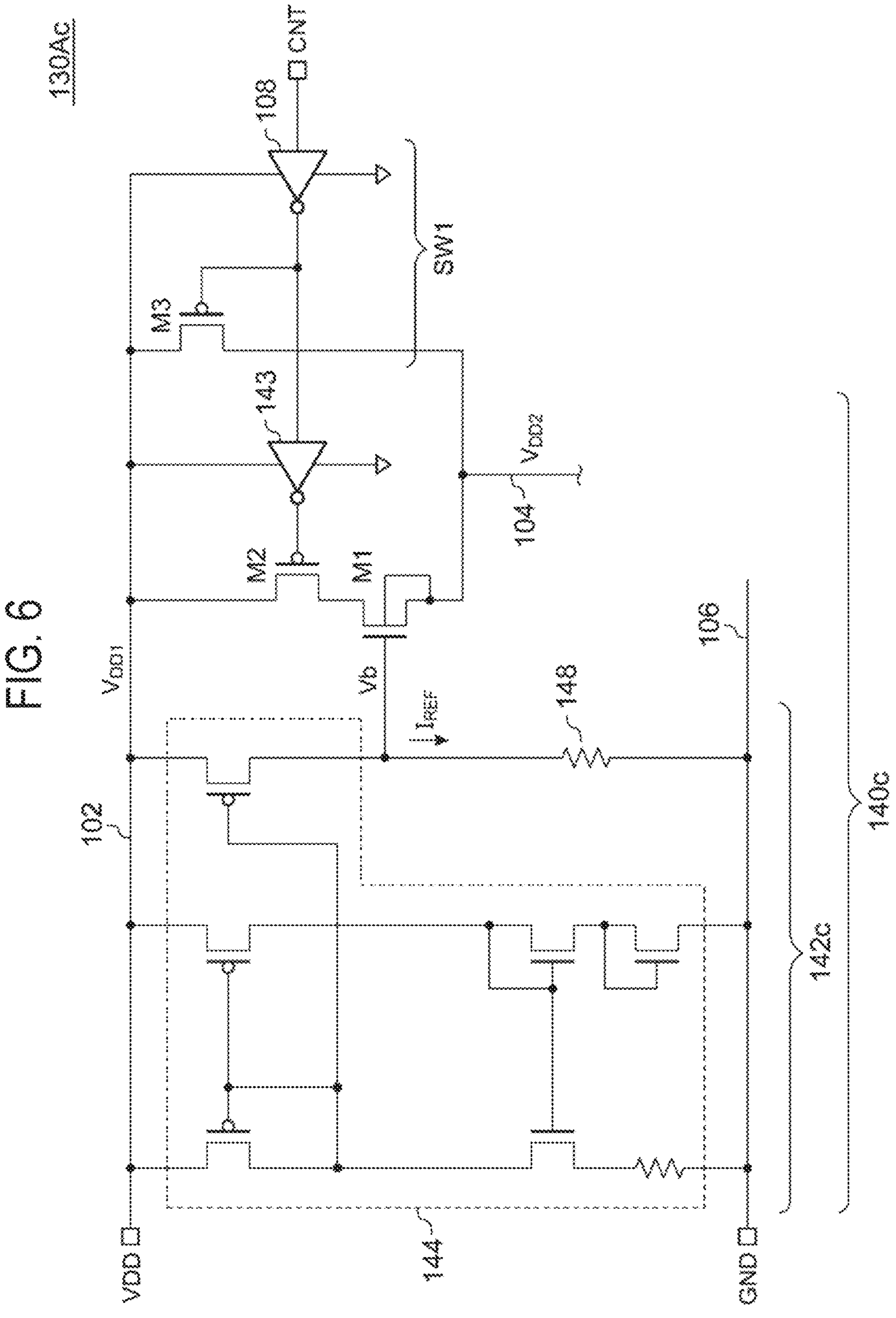
FIG. 6 is a circuit diagram of a power supply circuit according to one embodiment.

FIG. 6 is a circuit diagram of a power supply circuit 130Ac according to one embodiment. In the power supply control circuit 142*c*, the constant voltage elements 146 shown in FIG. 5 are replaced with an impedance element 148. The impedance element 148 is, for example, a resistor. The bias voltage Vb is $Vb = I_{REF} \times R$.

Figure 7:
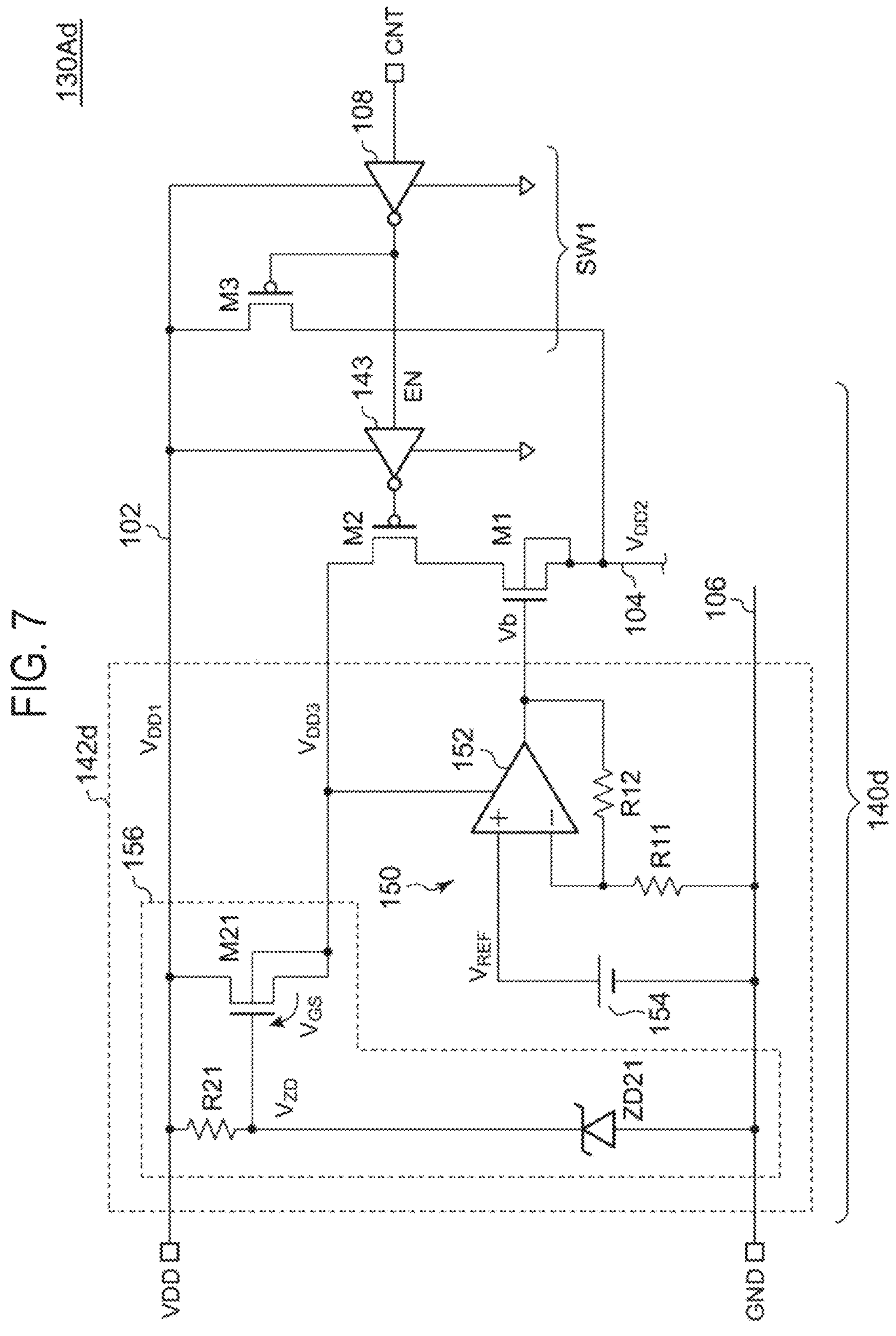
FIG. 7 is a circuit diagram of a power supply circuit according to one embodiment.

FIG. 7 is a circuit diagram of a power supply circuit 130Ad according to one embodiment. The power supply control circuit 142*d* includes a linear regulator 150. The linear regulator 150 includes an operational amplifier 152, a reference voltage source 154, and resistors R11 and R12. The bias voltage Vb is $Vb = V_{REF} \times (R11 + R12)/R11$. The voltage clamp circuit 156 includes a resistor R21, a Zener diode ZD21, and a transistor M21, which is an N-channel MOSFET, clamps the external power supply voltage $V_{DD1}$, and generates a power supply voltage $V_{DD3}$. $V_{DD3} = V_{ZD} - V_{GS}$. $V_{ZD}$ is a Zener voltage of the Zener diode.

The power supply voltage $V_{DD3}$ after clamping is supplied to the power supply node of the operational amplifier 152. Further, the power supply voltage $V_{DD3}$ after clamping is supplied to the second transistor M2.

Figure 8:
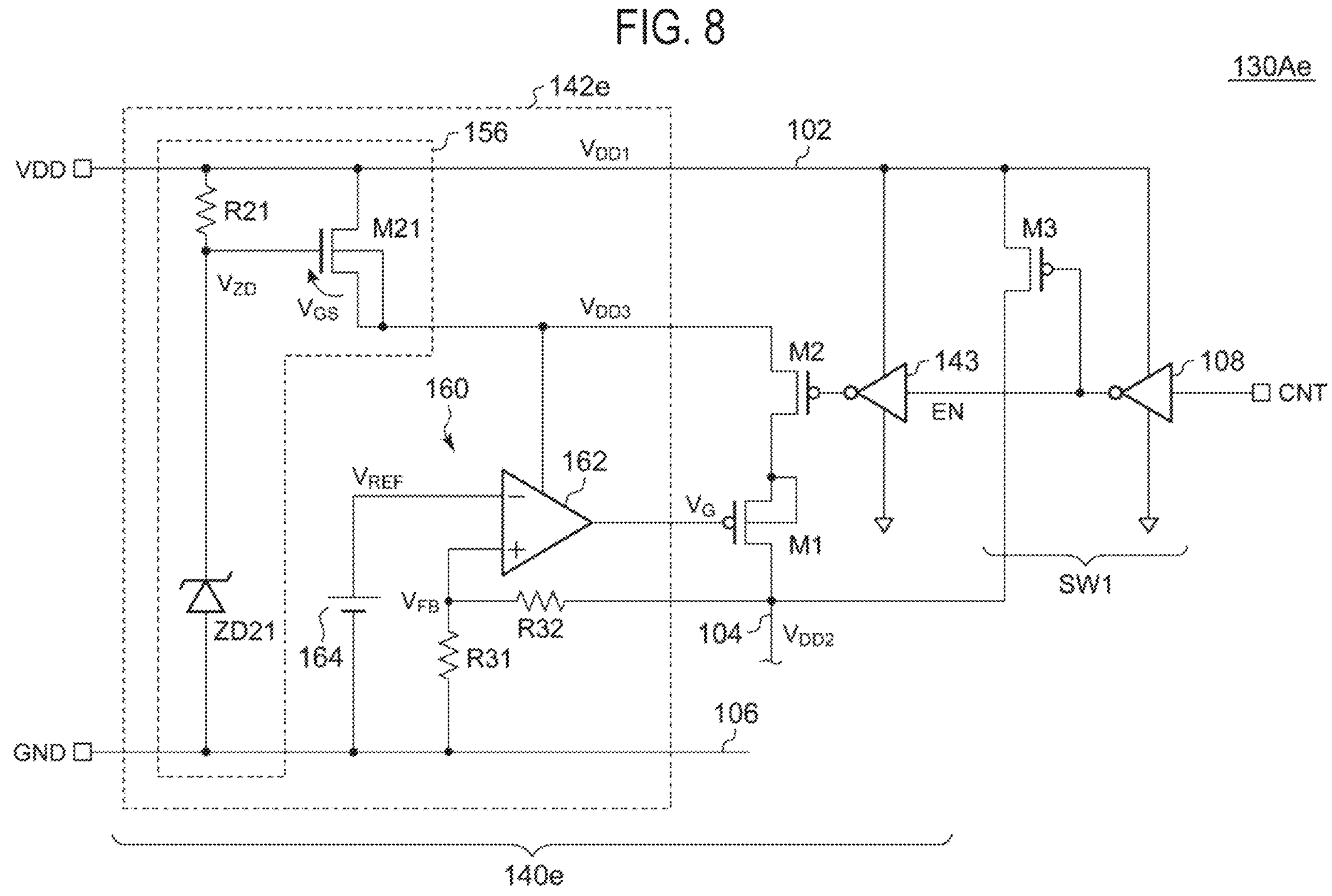
FIG. 8 is a circuit diagram of a power supply circuit according to one embodiment.

FIG. 8 is a circuit diagram of a power supply circuit 130Ae according to one embodiment. The power supply control circuit 142*e* and the first transistor M1 form a linear regulator 160. The first transistor M1 is a P-channel MOS- FET. The reference voltage source 164 generates a reference voltage $V_{REF}$. The resistors R31 and R32 divide the internal power supply voltage $V_{DD2}$, and generate a feedback voltage VFB. The operational amplifier 162 feedback-controls the gate voltage VG of the first transistor M1 so that the feedback voltage $V_{FB}$ according to the internal power supply voltage $V_{DD2}$ approaches the reference voltage $V_{REF}$, i.e., so that the error thereof approaches zero. The second voltage level $V_2$ is $V_2=V_{REF}\times(R31+R32)/R31$.

Embodiment 2

Figure 9:
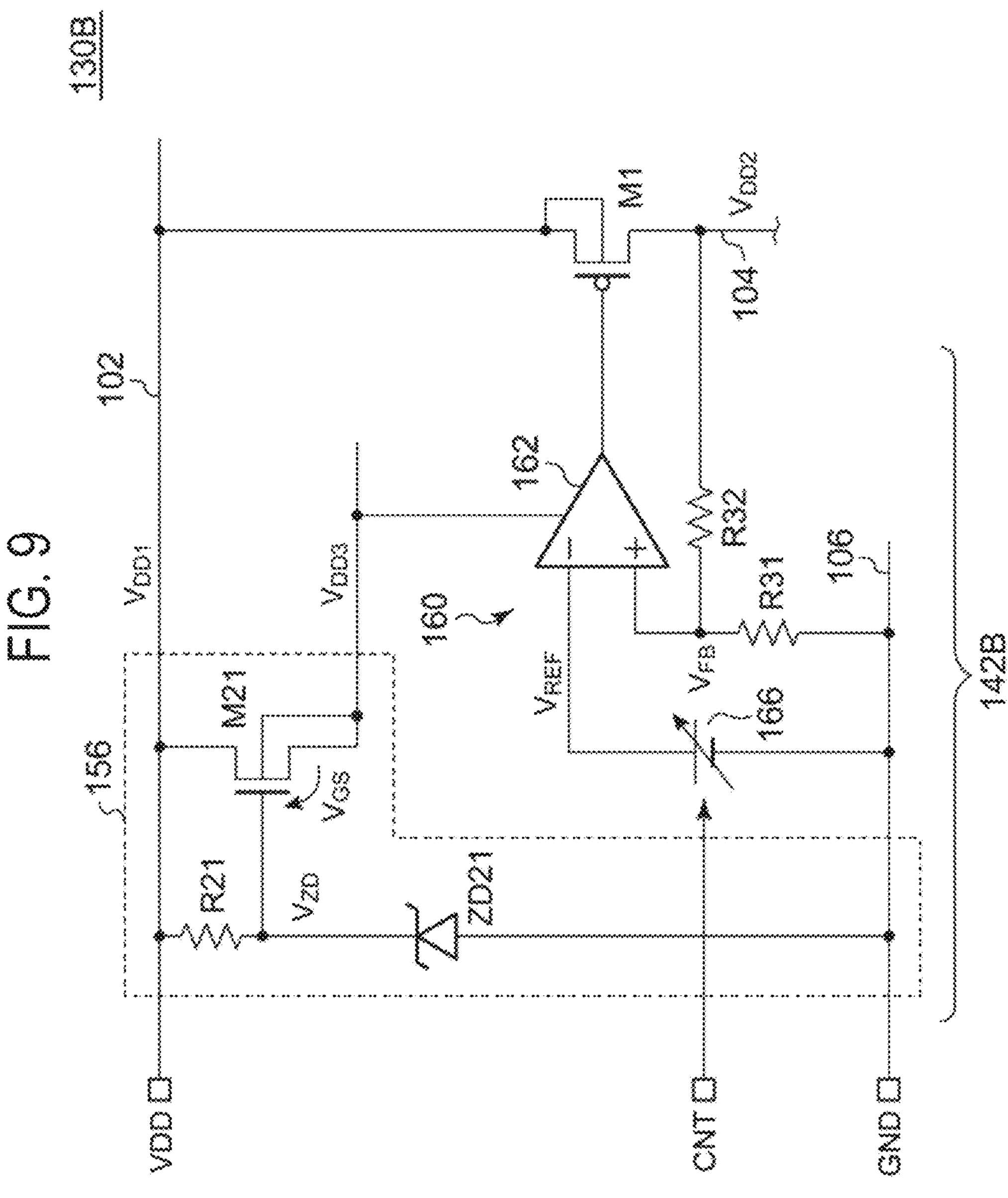
FIG. 9 is a circuit diagram of a power supply circuit according to Embodiment 2.

FIG. 9 is a circuit diagram of a power supply circuit 130B according to Embodiment 2. The power supply circuit 130B is a variable voltage source. The power supply control circuit 142B and the first transistor M1 form a linear regulator as in FIG. 7, and a variable reference voltage source 166 is installed instead of the reference voltage source 164. The reference voltage $V_{REF}$ generated by the variable reference voltage source 166 is at a voltage level $V_{REF1}$ when the control signal CNT is at the first level. The first voltage level $V_1$ is $V_1=V_{REF1}\times(R31+R32)/R31$.

The reference voltage $V_{REF}$ is at a voltage level $V_{REF2}$ when the control signal CNT is at the second level. The second voltage level $V_2$ is $V_2=V_{REF2}\times(R31+R32)/R31$.

Example 3

Figure 10:
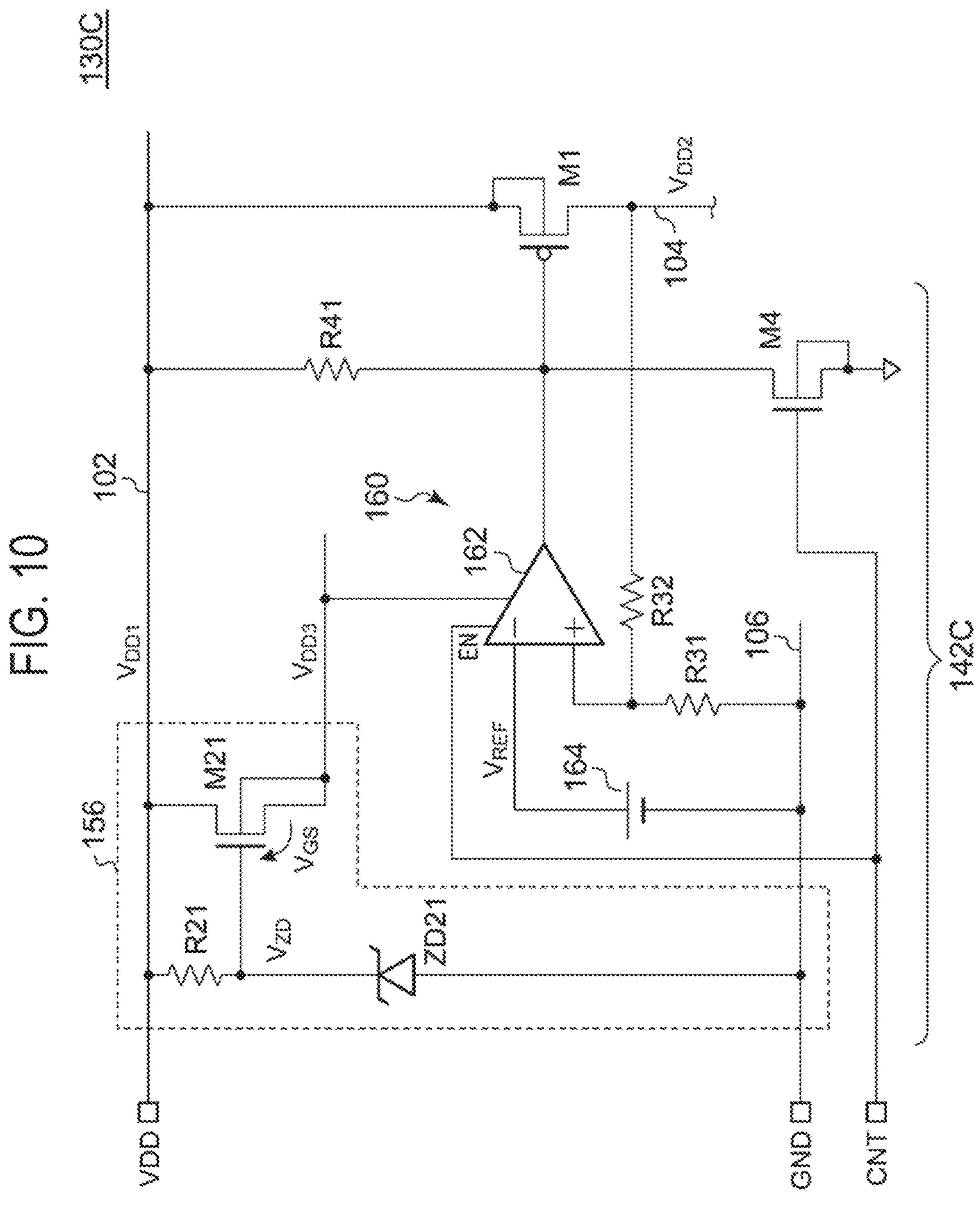
FIG. 10 is a circuit diagram of a power supply circuit according to Embodiment 3.

FIG. 10 is a circuit diagram of a power supply circuit 130C according to Embodiment 3. In the power supply circuit 130C, the power supply control circuit 142C and the first transistor M1 constitute a linear regulator. The power supply control circuit 142C includes a pull-up resistor R41 and a transistor M4.

The operational amplifier 162 includes an enable terminal EN. The operational amplifier 162 is in a disable state when the control signal CNT is at the first level, and is in an enable state when the control signal CNT is at the second level. The transistor M4 is an N-channel MOSFET. The transistor M4 is turned on when the control signal CNT is at the first level, and is turned off when the control signal CNT is at the second level.

When the control signal CNT is at the first level, the transistor M4 is turned on, so that a voltage of a low level (0 V) is applied to the gate of the first transistor M1, and the first transistor M1 is fully turned on. As a result, an internal power supply voltage $V_{DD2}$ having substantially the same voltage level as the external power supply voltage $V_{DD1}$ appears in the second power supply line 104.

When the control signal CNT is at the second level, the transistor M4 is turned off. The operational amplifier 162 is in an enable state, and an internal power supply voltage $V_{DD2}$ of the second voltage level $V_2$ is generated in the second power supply line 104.

$$V_2 = V_{REF} \times (R31 + R32)/R31.$$

Finally, some specific examples of the semiconductor integrated circuit 100 will be described.

Figure 11:
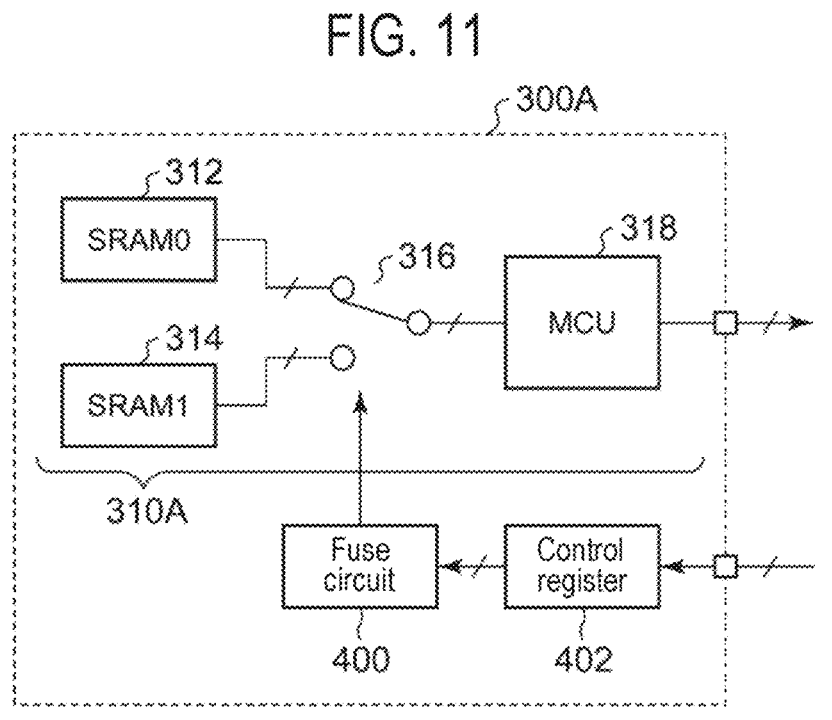

FIG. 11 is a block diagram showing an example (300A) of the semiconductor integrated circuit 300. The internal circuit 310A is a digital circuit and includes static random access memories (SRAMs) 312 and 314, a selector 316, and a microprocessor 318. Two SRAMs 312 and 314 are installed for redundancy, and one is selected by the selector 316.

The fuse circuit 400 is controllable via a control register 402, and the fuse circuit 400 is programmable with control information for the selector 316. The microprocessor 318 can access one of the two SRAMs 312 and 314 depending on a value written to the fuse circuit 400. According to this configuration, when an abnormality is detected in one of the two SRAMs 312 and 314 in a testing process of the semiconductor integrated circuit 300A, the yield can be improved by selecting the other normal SRAM.

Figure 12:
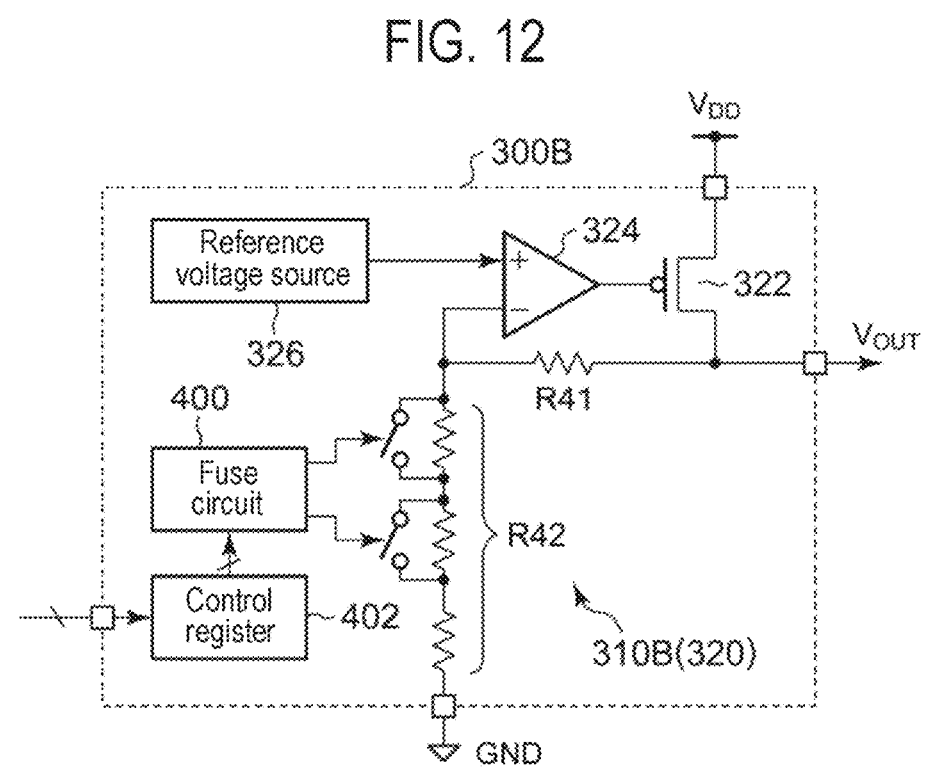

FIG. 12 is a diagram showing another example (300B) of the semiconductor integrated circuit 300. The internal circuit 310B includes a linear regulator (LDO: Low Drop Output) 320. The linear regulator 320 includes a transistor 322, an operational amplifier 324, a reference voltage source 326, and resistors R41 and R42.

In this example, the resistor R42 is a variable resistor, and the fuse circuit 400 is programmed with a set value for the variable resistor. As a result, a target value of an output voltage VOUT of the linear regulator 320 can be adjusted.

Figure 13:
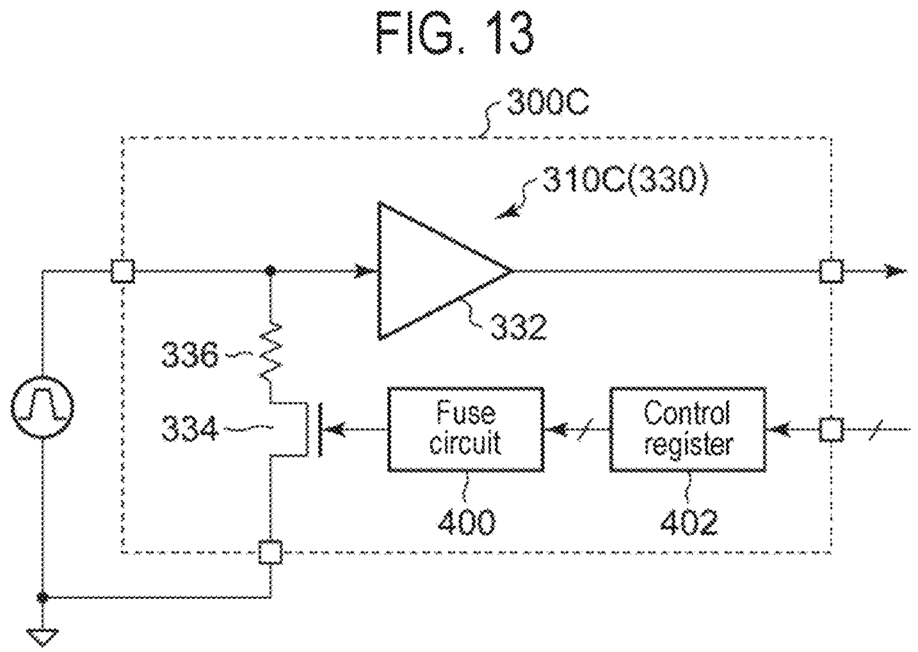
FIG. 13 is a diagram showing yet another example of a semiconductor integrated circuit.

FIG. 13 is a diagram showing another example (300C) of the semiconductor integrated circuit 300. The internal circuit 310C includes an interface circuit 330. The interface circuit 330 includes an input buffer 332, a pull-down resistor 336, and a switch 334. The fuse circuit 400 is programmed with an on/off setting value for the switch 334. As a result, the input pin of the semiconductor integrated circuit 300C can be switched between being used as a buffer receiver or as a pull-down pin.

The embodiments are exemplary. It will be understood by those skilled in the art that various modifications may be made to the combinations of the constituent elements and the processing processes, and that such modifications are also included in the present disclosure and may constitute the scope of the present invention.

Supplementary Notes

The following techniques are disclosed in this specification.

Item 1

A semiconductor integrated circuit, comprising:
- a power supply pin configured to receive an external power supply voltage;
- a fuse memory circuit including a fuse element; and
- a power supply circuit having an output connected to the fuse memory circuit, and configured to receive the external power supply voltage, the power supply circuit being switchable in response to a control signal between (i) a first state in which an internal power supply voltage of a first voltage level, which is capable of cutting the fuse element, is supplied to a power supply line of the fuse memory circuit and (ii) a second state in which the internal power supply voltage of a second voltage level lower than the first voltage level, which is incapable of cutting the fuse element, is supplied to the power supply line of the fuse memory circuit.

Item 2

The semiconductor integrated circuit of Item 1, wherein the first voltage level is substantially equal to the external power supply voltage.

Item 3

The semiconductor integrated circuit of Item 2, wherein the power supply circuit includes a constant voltage circuit configured to be in a disable state in the first state, and be in an enable state in the second state and generate the internal power supply voltage of the second voltage level in the power supply line of the fuse memory circuit, and a switch installed between the power supply pin and the power supply line of the fuse memory circuit and configured to be turned on in the first state and turned off in the second state.

Item 4

The semiconductor integrated circuit of Item 3, wherein the constant voltage circuit includes a first transistor installed between the power supply pin and the power supply line of the fuse memory circuit, and a power supply control circuit configured to supply a control voltage to a control terminal of the first transistor.

Item 5

The semiconductor integrated circuit of Item 4, wherein the constant voltage circuit is a source follower circuit or an emitter follower circuit.

Item 6

The semiconductor integrated circuit of Item 5, wherein the power supply control circuit includes a constant current source configured to generate a constant current, and at least one constant voltage element installed on a path of the constant current, and wherein the power supply control circuit is configured to supply the control voltage based on a voltage drop of the at least one constant voltage element to the control terminal of the first transistor.

Item 7

The semiconductor integrated circuit of Item 6, wherein the constant voltage element is a field effect transistor having a gate and a drain that are connected.

Item 8

The semiconductor integrated circuit of Item 5, wherein the power supply control circuit includes a constant current source configured to generate a constant current, and an impedance element installed on a path of the constant current, and wherein the power supply control circuit is configured to supply the control voltage based on a voltage drop of the impedance element to the control terminal of the first transistor.

Item 9

The semiconductor integrated circuit of Item 4, wherein a voltage control circuit includes a linear regulator.

Item 10

The semiconductor integrated circuit of any one of Items 4 to 9, wherein the constant voltage circuit further includes a second transistor connected in series to the first transistor between the power supply pin and the power supply line of the fuse memory circuit and configured to be turned off in the first state and turned on in the second state.

Item 11

The semiconductor integrated circuit of Item 1, wherein the power supply circuit includes a variable voltage circuit configured to generate the internal power supply voltage of the first voltage level in the power supply line of the fuse memory circuit in the first state and generate the internal power supply voltage of the second voltage level in the power supply line of the fuse memory circuit in the second state.

Item 12

The semiconductor integrated circuit of Item 11, wherein the variable voltage circuit includes a first transistor installed between the power supply pin and the power supply line of the fuse memory circuit, and a voltage control circuit configured to fully turn on the first transistor in the first state and feedback control a voltage of a control terminal of the first transistor so that the internal power supply voltage is brought close to the second voltage level in the second state.

Item 13

The semiconductor integrated circuit of Item 11, wherein the variable voltage circuit includes a first transistor installed between the power supply pin and the power supply line of the fuse memory circuit, and an operational amplifier having an input node receiving a feedback voltage based on the internal power supply voltage and a reference voltage and an output connected to a control terminal of the first transistor, and wherein a voltage level of the reference voltage is switchable between the first state and the second state.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor integrated circuit, comprising:

a power supply pin configured to receive an external power supply voltage;

a fuse memory circuit including a fuse element; and a power supply circuit having an output connected to the fuse memory circuit, and configured to receive the external power supply voltage, the power supply circuit being switchable in response to a control signal between (i) a first state in which an internal power supply voltage of a first voltage level, which is capable of cutting the fuse element, is supplied to a power supply line of the fuse memory circuit and (ii) a second state in which the internal power supply voltage of a second voltage level lower than the first voltage level, which is incapable of cutting the fuse element, is supplied to the power supply line of the fuse memory circuit, wherein the power supply circuit includes a constant voltage circuit configured to be in a disable state in the first state, and be in an enable state in the second state and generate the internal power supply voltage of the second voltage level in the power supply line of the fuse memory circuit, and wherein the constant voltage circuit includes:

a first transistor installed between the power supply pin and the power supply line of the fuse memory circuit; and a power supply control circuit configured to supply a control voltage to a control terminal of the first transistor.

2. The semiconductor integrated circuit of claim 1, wherein the first voltage level is substantially equal to the external power supply voltage.

3. The semiconductor integrated circuit of claim 2, wherein the power supply circuit includes:

a switch installed between the power supply pin and the power supply line of the fuse memory circuit and configured to be turned on in the first state and turned off in the second state.

4. The semiconductor integrated circuit of claim 1, wherein the constant voltage circuit is a source follower circuit or an emitter follower circuit.

5. The semiconductor integrated circuit of claim 4, wherein the power supply control circuit includes:

a constant current source configured to generate a constant current, and at least one constant voltage element installed on a path of the constant current, and wherein the power supply control circuit is configured to supply the control voltage based on a voltage drop of the at least one constant voltage element to the control terminal of the first transistor.

6. The semiconductor integrated circuit of claim 5, wherein the constant voltage element is a field effect transistor having a gate and a drain that are connected.

7. The semiconductor integrated circuit of claim 4, wherein the power supply control circuit includes:

a constant current source configured to generate a constant current, and an impedance element installed on a path of the constant current, and wherein the power supply control circuit is configured to supply the control voltage based on a voltage drop of the impedance element to the control terminal of the first transistor.

8. The semiconductor integrated circuit of claim 1, wherein a voltage control circuit includes a linear regulator.

9. The semiconductor integrated circuit of claim 1, wherein the constant voltage circuit further includes a second transistor connected in series to the first transistor between the power supply pin and the power supply line of the fuse memory circuit and configured to be turned off in the first state and turned on in the second state.

10. A semiconductor integrated circuit, comprising:

a power supply pin configured to receive an external power supply voltage;

a fuse memory circuit including a fuse element; and a power supply circuit having an output connected to the fuse memory circuit, and configured to receive the external power supply voltage, the power supply circuit being switchable in response to a control signal between (i) a first state in which an internal power supply voltage of a first voltage level, which is capable of cutting the fuse element, is supplied to a power supply line of the fuse memory circuit and (ii) a second state in which the internal power supply voltage of a second voltage level lower than the first voltage level, which is incapable of cutting the fuse element, is supplied to the power supply line of the fuse memory circuit, wherein the power supply circuit includes a variable voltage circuit configured to generate the internal power supply voltage of the first voltage level in the power supply line of the fuse memory circuit in the first state and generate the internal power supply voltage of the second voltage level in the power supply line of the fuse memory circuit in the second state, and wherein the variable voltage circuit includes:

a first transistor installed between the power supply pin and the power supply line of the fuse memory circuit; and a voltage control circuit configured to fully turn on the first transistor in the first state and feedback control a voltage of a control terminal of the first transistor so that the internal power supply voltage is brought close to the second voltage level in the second state.

11. The semiconductor integrated circuit of claim 10, wherein the variable voltage circuit includes:

an operational amplifier having an input node receiving a feedback voltage based on the internal power supply voltage and a reference voltage and an output connected to a control terminal of the first transistor, and wherein a voltage level of the reference voltage is switchable between the first state and the second state.

* * * * *